(12) United States Patent
Watkins et al.

(10) Patent No.: US 7,378,844 B2
(45) Date of Patent: May 27, 2008

(54) MAGNETIC RESONANCE SYSTEM, RECEIVER & METHOD OF GENERATING DETECTING AND DIGITIZING ANALOG MR SIGNALS SOLELY WITHIN THE MR SHIELDED ENVIRONMENT

(75) Inventors: Ronald Dean Watkins, Niskayuna, NY (US); Richard Louis Frey, Delanson, NY (US); Glen Peter Koste, Niskayuna, NY (US); Naveen Stephan Chandra, Schenectady, NY (US)

(73) Assignee: General Electric Company, Niskayuna, NY (US)

( * ) Notice: Subject to any disclaimer, the term of this patent is extended or adjusted under 35 U.S.C. 154(b) by 22 days.

(21) Appl. No.: 10/955,629

(22) Filed: Sep. 30, 2004

(65) Prior Publication Data

US 2006/0066312 A1 Mar. 30, 2006

(51) Int. Cl.
*G01V 3/00* (2006.01)
(52) U.S. Cl. .................. 324/304; 324/318; 324/322; 324/305; 324/307
(58) Field of Classification Search ............... 324/322, 324/304, 318, 307, 309, 305
See application file for complete search history.

(56) References Cited

U.S. PATENT DOCUMENTS

| | | | | |
|---|---|---|---|---|
| 4,719,424 | A | * | 1/1988 | Jimbo et al. ............... 324/309 |
| 5,170,123 | A | * | 12/1992 | Holland et al. ............. 324/322 |
| 5,245,288 | A | * | 9/1993 | Leussler .................... 324/322 |
| 5,296,813 | A | * | 3/1994 | Holmes et al. ............. 324/322 |
| 5,384,536 | A | * | 1/1995 | Murakami et al. .......... 324/309 |
| 5,545,999 | A | * | 8/1996 | Mueller et al. ............. 324/322 |
| 5,739,936 | A | | 4/1998 | Yakymyshyn et al. |
| 5,898,306 | A | * | 4/1999 | Liu et al. ................... 324/322 |
| 6,198,287 | B1 | * | 3/2001 | Heiserholt et al. .......... 324/322 |
| 6,339,717 | B1 | | 1/2002 | Baumgartl et al. |
| 6,633,162 | B2 | * | 10/2003 | Zhang et al. ............... 324/322 |
| 2003/0062901 | A1 | * | 4/2003 | Zhang et al. ............... 324/322 |
| 2003/0076103 | A1 | * | 4/2003 | Okada et al. ............... 324/321 |
| 2003/0206019 | A1 | * | 11/2003 | Boskamp .................... 324/322 |

(Continued)

FOREIGN PATENT DOCUMENTS

EP 1193506 4/2002

(Continued)

OTHER PUBLICATIONS

Stewart C. Bushong textbook: Magnetic Resonance Imaging physical and Biological Principles Second Edition pp. 159-163 the top two paragraphs, published in 1996.*

(Continued)

*Primary Examiner*—Brij Shrivastav
*Assistant Examiner*—Tiffany A. Fetzner
(74) *Attorney, Agent, or Firm*—Ann M. Agosti; Patrick K. Patnode (57) ABSTRACT

A magnetic resonance (MR) system and method for generating information about an object is provided. The MR system comprises at least one MR detector configured to sense a plurality of signals within a shielded environment and a digitizing circuit configured for digitizing the analog signals to generate digital signals. The MR detector, digitizing circuit is located within a shielded environment. The system further comprises a first transmission element configured for transmitting the plurality of digital signals to a plurality of electronic devices.

32 Claims, 5 Drawing Sheets

U.S. PATENT DOCUMENTS

| | | | |
|---|---|---|---|
| 2003/0210052 A1* | 11/2003 | Okada et al. | 324/318 |
| 2004/0097802 A1* | 5/2004 | Cohen | 600/411 |
| 2005/0283068 A1* | 12/2005 | Zuccolotto et al. | 600/410 |
| 2006/0066312 A1* | 3/2006 | Watkins et al. | 324/322 |
| 2007/0182409 A1* | 8/2007 | Varjo | 324/304 |

FOREIGN PATENT DOCUMENTS

| | | |
|---|---|---|
| WO | 03032002 | 4/2003 |
| WO | 2004089211 | 10/2004 |
| WO | 2006008665 | 1/2006 |

OTHER PUBLICATIONS

M. Sethi et al., "Digitising the wireless mri link: a space-time cdma approach," Intelligent Information Systems Conference, The Seventh Australian and New Zealand 2001, Nov. 18-21, 2001, pp. 31-36.

NL Search Report, NL1030055, Jun. 26, 2007.

* cited by examiner

MAGNETIC RESONANCE SYSTEM, RECEIVER & METHOD OF GENERATING DETECTING AND DIGITIZING ANALOG MR SIGNALS SOLELY WITHIN THE MR SHIELDED ENVIRONMENT

BACKGROUND

The invention relates generally to imaging and spectroscopy systems and more specifically to magnetic resonance systems and methods.

High field magnetic systems such as magnetic resonance (MR) systems are typically located inside a shielded environment. The shielded environment is where a magnet bore of a magnetic resonance system is located. Typically, a magnetic resonance detector is used to detect electromagnetic signals carrying information about the object being imaged. The electromagnetic signals are then amplified and transmitted to an operator console located outside the shielded environment for further processing.

Several MR detectors are used as sensing elements in MRI systems and are used for sensing and transmitting electromagnetic signals. MR detectors may include receive coils such as radio frequency coil, surface coils and surface coil arrays. To increase the quality of the images, or extend field of view, or imaging speed, MRI systems sometimes comprise several MR detectors.

One problem with increasing the number of MR detectors in the MR system is corresponding increase of conductive cables. Conductive cables are used to carry analog RF signals from the MR detectors to electronics located outside the imaging volume and magnet bore. Conductive cables are also used to carry control signals and electrical energy from the system electronics outside the magnet bore to the MR detector. The electrical energy may be used to power a preamplifier mounted on or near the MR detector.

Conductive cables can be bulky, stiff and hard to mechanically manipulate. In addition, they can also create radio frequency loops that could potentially cause a burn to be induced in the imaging subject. Furthermore, conductive cables and the conductive shields used on the conductive cables tend to pick up transient or interference signals and couple them into the MR detector array causing an image artifact and image degradation.

Another problem when increasing the number of MR detectors is the corresponding increase in space required to install the MR detectors and the conductive cables. Also, implementation of such systems contributes to an overall increase in the cost of the system.

Therefore, there is a need to transmit signals with high fidelity between the receive coils in magnet bore to electronics outside the magnet bore.

BRIEF DESCRIPTION

Briefly, according to one aspect of the invention, a MR system is provided. The MR system comprises at least one MR detector configured to sense a plurality of signals within a shielded environment. The MR system further comprises a digitizing circuit (hereinafter at least one digitizing circuit) configured for digitizing the analog signals to generate digital signals. The MR detector, digitizing circuit is located within a shielded environment. The MR system further comprises a first transmission element configured for transmitting the plurality of digital signals to a plurality of electronic devices In another embodiment, a method for generating information about an object using a magnetic resonance system is provided. The method comprises sensing a plurality of analog signals within a shielded environment and digitizing the analog signals to generate digital signals. The digitizing occurs within the shielded environment. The method further comprises transmitting the digital signals to a plurality of electronic devices located inside the shielded environment.

In an alternate embodiment, an integrated receiver circuit adapted for use in a magnetic resonance (MR) system is provided. The integrated receiver comprises a receiver coil adapted for sensing a plurality of analog signals and a digitizing circuit coupled to the receiver coil and configured for converting the plurality of analog signals to a corresponding plurality of digital signals.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Figure 1:
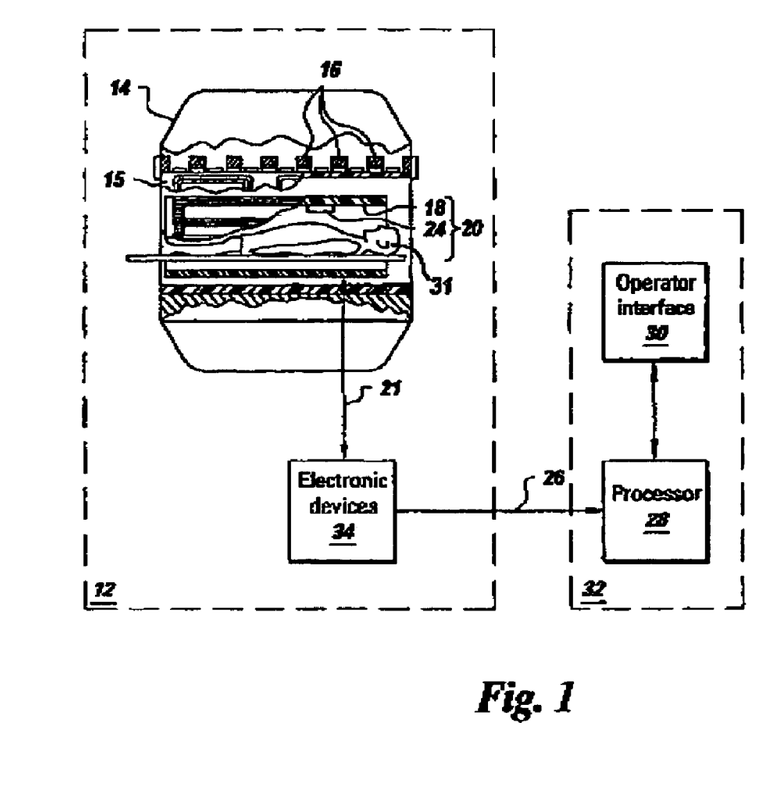
FIG. 1 is a block diagram illustrating one embodiment of a magnetic resonance imaging system implemented according to one aspect of the invention.

FIG. 1 is a block diagram of an exemplary embodiment of a high field magnetic resonance (MRI) system 10 which may be use in accordance with aspects of the invention. Other magnetic resonance systems such as magnetic resonance spectroscopy systems, which can be used to analyze material properties may also benefit from the present techniques. The following discussion of an MRI system is merely an example of one such implementation and is not intended to be limiting in terms of modality or anatomy.

As used herein, the term "high field" refers to magnetic fields produced by the MRI system that is greater than about 0.5 Tesla. For embodiments of the invention the high field is desirably 0.5 Tesla to 7 Tesla. The MRI system could be, for example, a GE-Signa MR scanner available from GE Medical Systems, Inc., which is adapted to perform the method of the present invention, although other systems could be used as well. Each component is described in further detail below.

As used herein, "adapted to", "configured" and the like refer to devices in a system to allow the elements of the system to cooperate to provide a described effect; these terms also refer to operation capabilities of electrical or optical elements such as analog or digital computers or application specific devices (such as an application specific integrated circuit (ASIC)), amplifiers or the like that are programmed to provide an output in response to given input signals, and to mechanical devices for optically or electrically coupling components together.

The operation of the MR system is controlled from an operator console 32, which includes processor 28 and operator interface 30. The console 32 comprises a processor 28 that enables an operator to control the production and display of images via operator interface 30. The processor includes a number of modules, which communicate with each other through a backplane. These include an image processor module, a CPU module, a pulse generator module, and a memory module, known in the art as a frame buffer for storing image data arrays. The processor is typically linked to a disk storage and a tape drive (not shown) for storage of image data and programs, and it communicates with a separate system control (not shown), through a high speed serial link.

The pulse generator module connects to the operator console through a serial link. The system control receives commands from the operator which indicate the scan sequence that is to be performed. The pulse generator module operates the system components to carry out the desired scan sequence. It produces data that indicate the timing, strength, and shape of the radio frequency (RF) pulses which are to be produced, and the timing of and length of the data acquisition window. The pulse generator module connects to a set of gradient amplifiers (not shown) to indicate the timing and shape of the gradient pulses to be produced during the scan.

The gradient waveforms produced by the pulse generator module are applied to a gradient amplifier system (not shown) comprising of Gx, Cy and Gz amplifiers (not shown). Each gradient amplifier excites a corresponding gradient coil in an bore generally designated 15 to produce the magnetic field gradients used for position encoding acquired signals. The gradient coil bore 15 forms part of a magnet bore 14, which includes a polarizing magnet 16, and a whole-body receive coil 18. In the illustrated embodiment, the receive coil 18 is a radio frequency coil. Imaging volume 20 is shown as the area within magnet bore 14 for receiving subject 31 and includes a patient bore. As used herein, the usable volume of a MRI scanner is defined generally as the volume within volume 20 that is a contiguous area inside the patient bore where homogeneity of main, gradient and RF fields are within known, acceptable ranges for imaging.

A transmitter module is adapted to produce pulses and the pulses are provided to receive coil 18. The resulting signals radiated by the excited nuclei in the subject 31 may be sensed by the same receive coil 18 and provided to digitizing circuit 24.

Digitizing circuit 24 is configured for digitizing the analog signals to generate digital signals. In one embodiment, the digital signals are then transmitted to electronic devices 34 via a first transmission element 21. In the illustrated embodiment, the first transmission element is an optical conduit.

It may be noted that the receive coil, digitizing circuit is located within a shielded environment 12. In one embodiment the digitizing circuit is located within magnetic bore. In the illustrated embodiment, the digitizing circuit is located within imaging volume 20.

The digital signals conditioned by electronic devices are then transferred to a memory module in the operator console via second transmission element 26. Examples of second transmission elements include, but are not limited to optical conduits, a coaxial cables and wireless networks. When the scan is completed and an entire array of data has been acquired in the memory module. A processor (not shown) operates to Fourier transform the data into an array of image data. In response to commands received from an operator, these image data may be further processed by an image processor and subsequently displayed.

In one embodiment, the digital signals are transmitted as a serial output. In another embodiment, the digitizing circuit may include a plurality of digitizing circuits (not shown) configured for generating a plurality of digital signals. The digital signals are then transmitted in parallel to the electronic devices and/or the processor. In a more specific embodiment, the digitizing circuit comprises a plurality of digitizing circuits configured for generating a plurality of digital signals. The plurality of digital signals are further combined to generate a single digital signal which is transmitted to the electronic device and/or the processor.

As illustrated in FIG. 1, the magnet bore 14, gradient coil 15, polarizing magnet 16, receive coil 18 and digitizing circuit are located within shielded room 12. The operator console is located outside the shielded room. The MR signals are transmitted to the operator console using the second transmission element.

As described earlier, the digitizing circuit is adapted for use in high magnetic fields ranging from 0.5 Tesla to 18 Tesla. The manner in which the digitizing circuit may be implemented is described in further detail with reference to FIG. 2 through FIG. 6.

Figure 2:
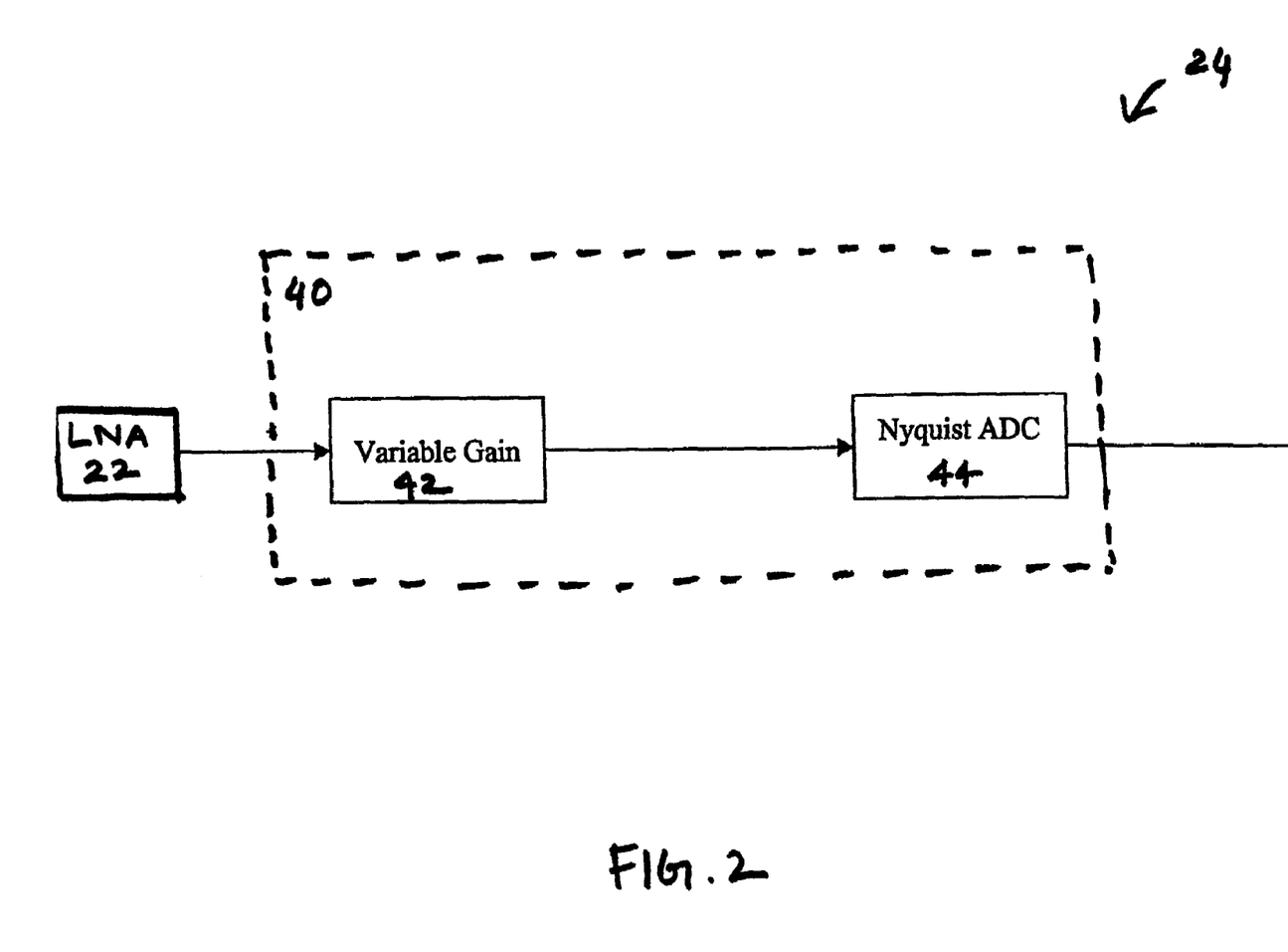
FIG. 2 and FIG. 3 are block diagrams illustrating embodiments of the digitizing circuit implemented using a direct conversion system.

FIG. 2 is a block diagram of one embodiment of digitizing circuit implemented according to one aspect of the invention. Digitizing circuit comprises a direct conversion system 40. Each component of the direct conversion system is described in further detail below.

Direct conversion system receives analog signals from low noise amplifier 22. The analog signals are provided to variable gain block 42, which is adapted to introduce a desired amount of gain for the analog signals. It may be noted that variable gain block may comprise a variable gain amplifier (VGA), an attenuator, or any combination thereof.

These signals are then provided to Nyquist analog to digital converter (ADC) 44. The Nyquist ADC is configured to convert the analog signals to corresponding digital signals by utilizing the Nyquist principle which states that the sampling rate of the ADC is at least twice the frequency of the analog signal in order to allow the signal to be completely represented with no aliasing effects.

Figure 3:
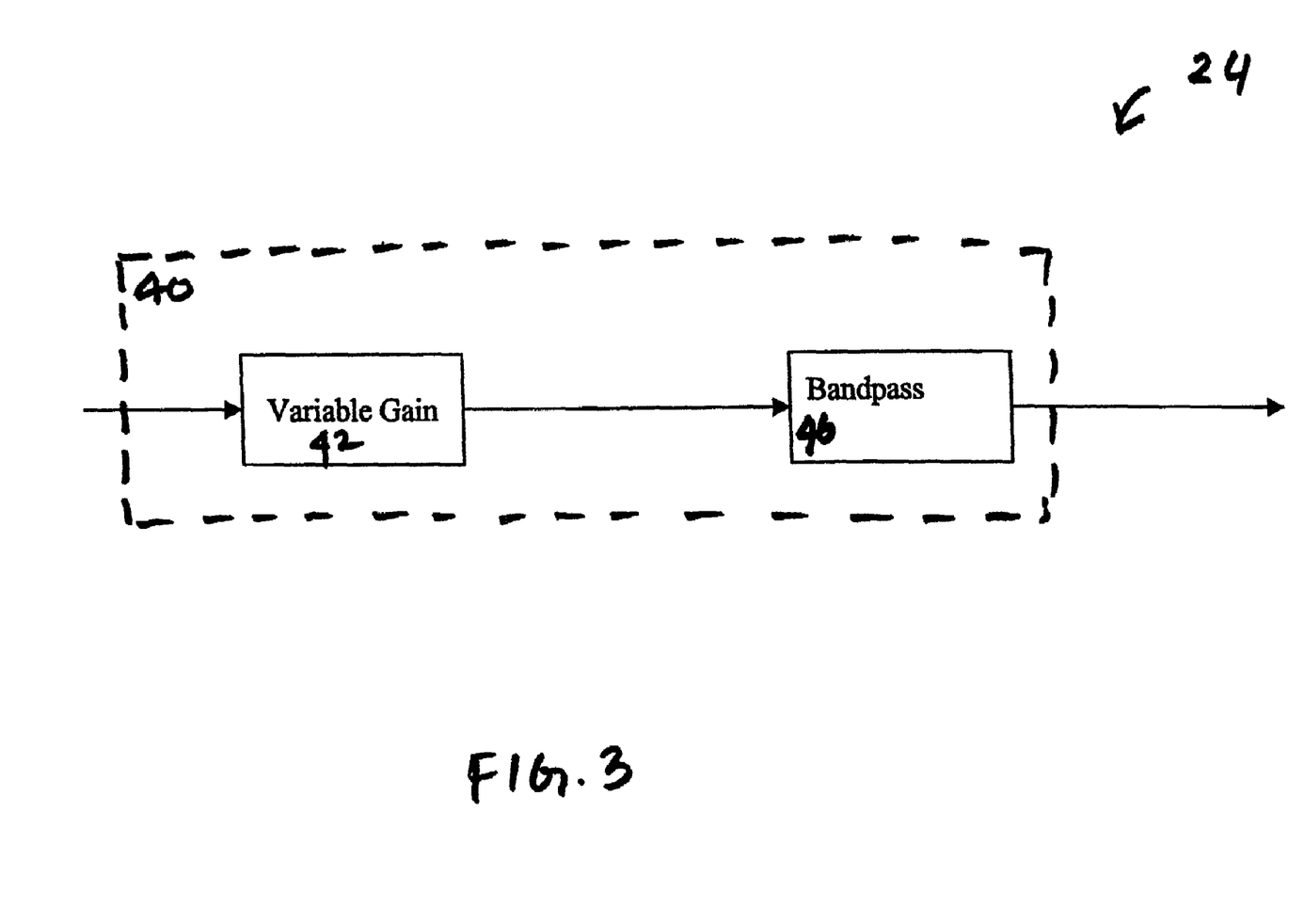

In another embodiment illustrated in FIG. 3, the direct conversion system 40 is implemented using a bandpass ADC 46. In such converters, the sampling rate is typically lower than twice the frequency of the analog signal. The bandpass ADC converts the analog signal to corresponding digital signal and is transmitted using transmission element 26.

Figure 4:
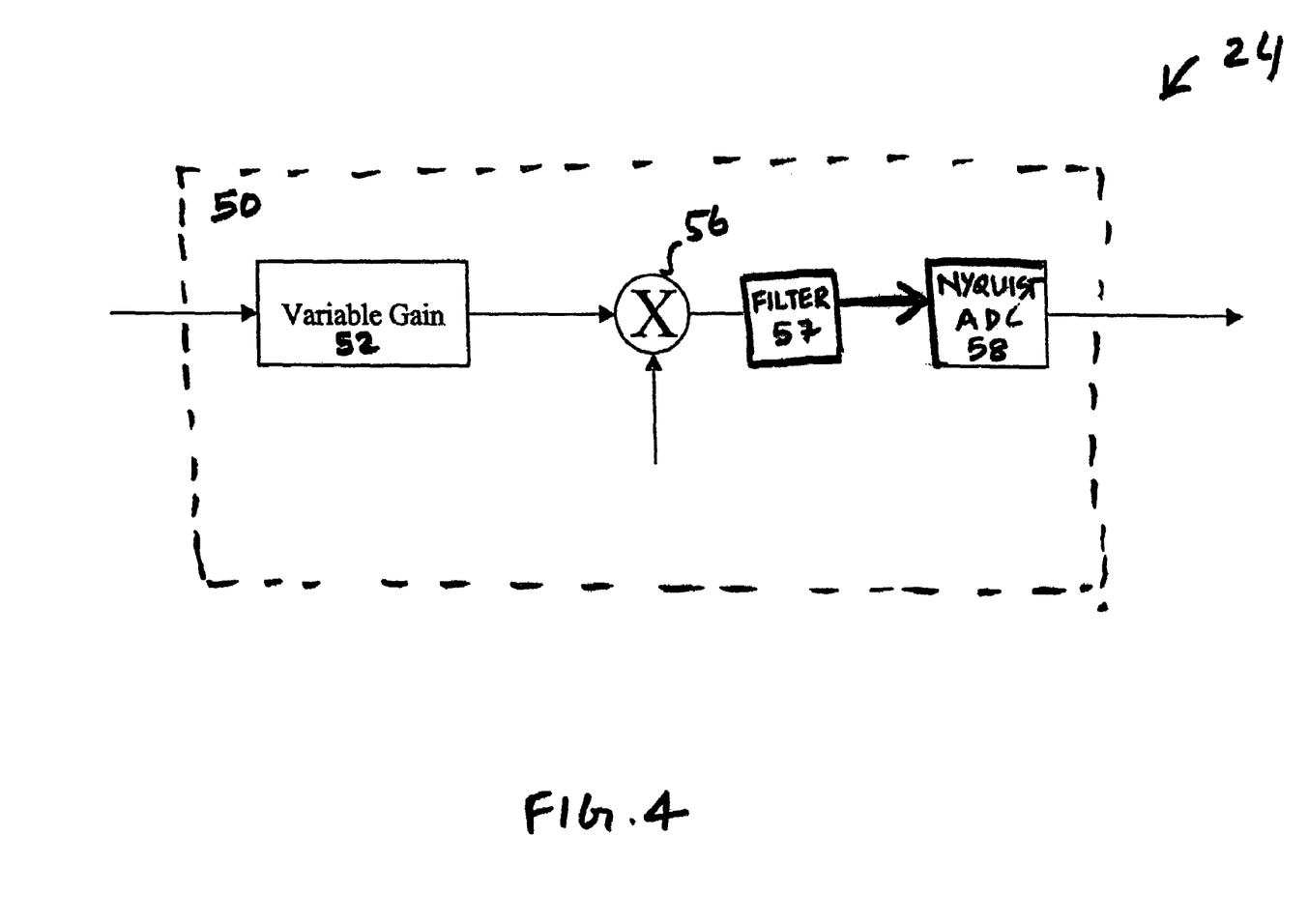
FIG. 4 are block diagrams illustrating embodiments of the digitizing circuit implemented using heterodyning receiver circuit.

FIG. 4 is a block diagram of another embodiment of digitizing circuit 24 implemented using a heterodyning receiver system 50. The heterodyning receiver system comprises a variable gain block 52 and buffer 54. The analog signal received from the low noise amplifier is passed through the variable gain block and provided to mixer 56. Variable gain 52 provides a control means for adjusting the gain depending on the amplitude of the analog signal Mixer 56 receives both the larmar frequency analog signal and local oscillator frequency signal and generates a corresponding intermediate frequency signal. Mixer 56 comprises active mixers implemented using non-magnetic components as is well known in the applied art. The intermediate frequency signal is provided to filter 57 where undesired sidebands may be removed. The filtered signal is provided to Nyquist ADC 58.

Nyquist ADC 58 operates in a similar manner as described with reference to Nyquist ADC 44 in FIG. 2. Nyquist ADC may be implemented using a ceramic filter or lumped element LC filter with nonmagnetic inductors. In one embodiment, an output of the ADC may have a serial data output.

Figure 5:
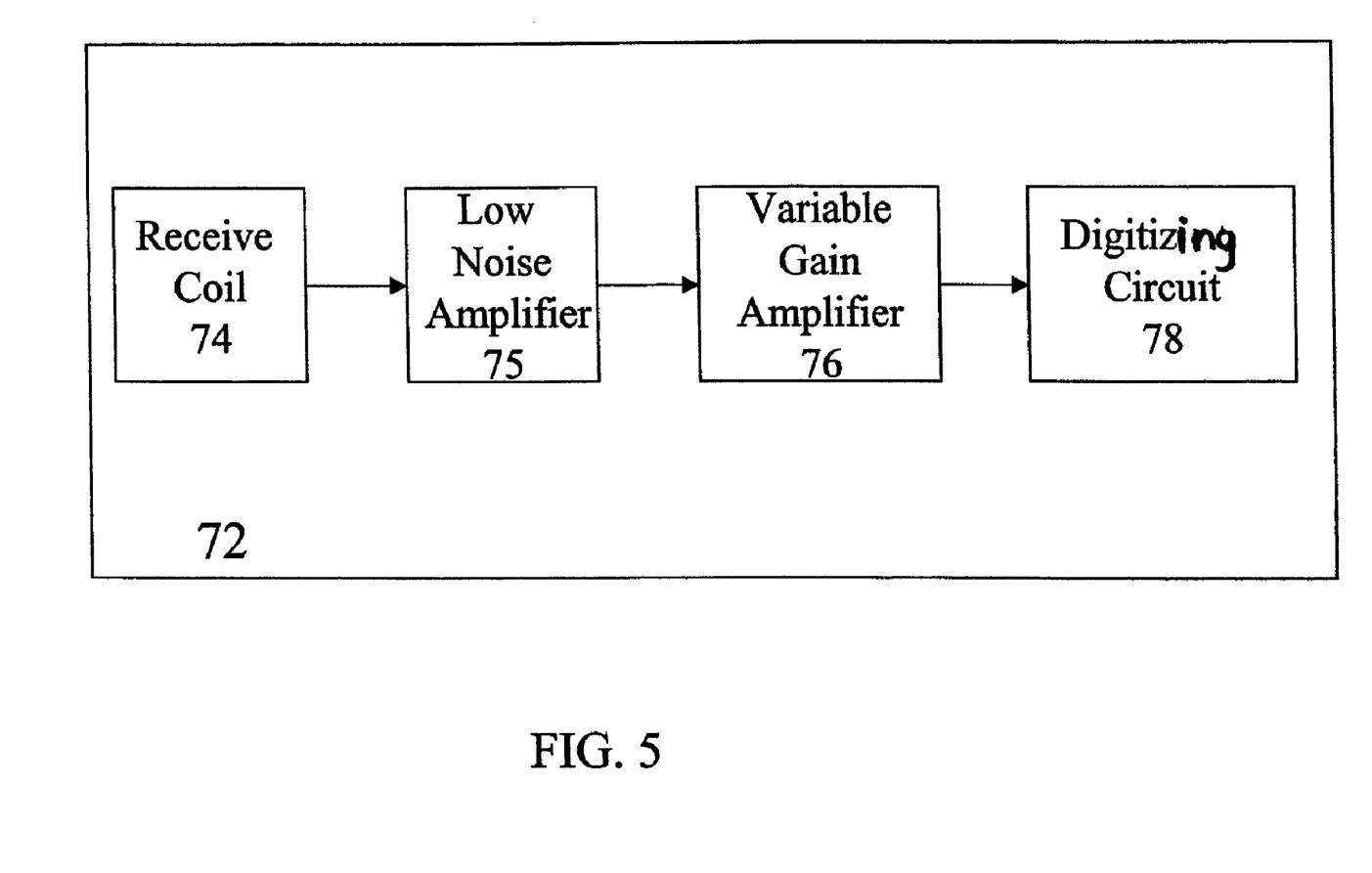
FIG. 5 is a block diagram of an embodiment of an integrated receiver system implemented according to one aspect of the invention.

As described wit reference to FIG. 1, in one embodiment digitizing circuit and the receiver coil are separate components located within the shielded room. In a more specific embodiment of the invention, an integrated receiver circuit 72 adapted for use in a magnetic resonance (MR) system is provided as illustrated in FIG. 5. Each component is described in further detail below.

The integrated receiver comprises a receiver coil 74 adapted for sensing a plurality of analog signals. The receiver coil may be a surface coil, surface coil array or a radio frequency coil. The integrated receiver is adapted for use in a high magnetic field ranging from 0.5 Tesla to 18 Tesla.

Digitizing circuit 78 is coupled to the receiver coil and is configured for converting the plurality of analog signals to a corresponding plurality of digital signals. The digitizing circuit may be an analog to digital converter or an analog to optical converter. Digitizing circuit may be implemented using any one of the techniques described in FIG. 2 through FIG. 5.

In the illustrated embodiment, the integrated receiver circuit further includes a low noise amplifier 75. A variable gain amplifier 76 is coupled between the low noise amplifier 75 and the digitizing circuit. The variable gain amplifier is configured for amplifying the plurality of analog signals and providing the amplified signals to the digitizing circuit.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A magnetic resonance (MR) system for generating signals representative of information about an object, the MR system comprising:
   at least one MR detector configured to sense a plurality of analog signals generated within a shielded environment;
   a digitizing circuit configured for converting the analog signals to digital optical signals; wherein the MR detector and digitizing circuit are located solely within the shielded environment; and
   a first transmission element comprising an optical conduit disposed solely within the shielded environment and that is configured for transmitting the plurality of digital optical signals to a plurality of electronic devices disposed solely within the shielded environment;
   wherein a plurality of digital optical signal is transmitted from the plurality of electronic devices to a processor outside the shielded environment using a second transmission element comprising at least one optical fiber in response to the digital optical signals transmitted from the digitizing circuit to the plurality of electronic devices, and wherein the processor is configured to receive and process the digital optical signals received by the processor to generate the information about the object.

2. The MR system of claim 1, wherein the magnetic system comprises a magnetic resonance imaging a system.

3. The MR system of claim 1, wherein the digitizing circuit is placed within a magnet bore, wherein the magnet bore is within the shielded environment.

4. The MR system of claim 1, wherein the digitizing circuit is placed within an imaging volume, wherein the imaging volume is within the shielded environment.

5. The MR system of claim 1, wherein the magnetic system comprises a magnetic resonance spectroscopy system.

6. The MR system of claim 1, wherein the plurality of electronic devices include an amplifier, wherein the amplifier is configured to amplify the plurality of digital optical signals received by the plurality of electronic devices.

7. The MR system of claim 1, wherein the digitizing circuit comprises a plurality of digitizing circuits configured for generating a plurality of digital signals, and wherein the digital signals are transmitted in parallel.

8. The MR system of claim 1, wherein the digitizing circuit comprises a plurality of digitizing circuits configured for generating a plurality of digital signals, and wherein the plurality of digital signals are further combined to generate a single digital signal.

9. The MR system of claim 1, wherein the digitizing circuit comprises a direct conversion system.

10. The MR system of claim 9, wherein the direct conversion system comprises a Nyquist converter.

11. The MR system of claim 9, wherein the direct conversion system comprises a band pass converter.

12. The MR system of claim 1, wherein the digitizing circuit comprises a heterodyning receiver system.

13. The MR system of claim 12, wherein the heterodyning receiver system comprises a Nyquist converter.

14. The MR system of claim 1, wherein the digital optical signals transmitted to the processor are transmitted as a serial output.

15. A receiver system configured for use in a magnetic resonance (MR) system, the receiver system comprising:
   an MR receiver coil circuit within a shielded environment and adapted for sensing a plurality of analog signals generated within the shielded environment and further adapted solely within the shielded environment for converting the plurality of analog signals to digital signals;
   an optical converter coupled to the receiver coil circuit and configured for converting the plurality of digital signals to a corresponding plurality of optical signals; and
   an optical conduit disposed solely within the shielded environment and configured for transmitting the plurality of optical signals to a plurality of electronic devices disposed soley within the shielded environment.

16. The integrated receiver of claim 15, wherein the receiver coil circuit further comprises an amplifier configured for amplifying the plurality of analog signals.

17. The integrated receiver of claim 15, wherein the integrated receiver is adapted for use in a high magnetic field.

18. The integrated receiver of claim 17, wherein high magnetic field ranges from 0.5 Tesla to 18 Tesla.

19. A method for generating information about an object using a magnetic resonance system, the method comprising:
   sensing a plurality of analog signals generated within a shielded environment;
   converting the analog signals to digital optical signals; wherein the converting occurs solely within the shielded environment;
   transmitting the digital optical signals to a plurality of electronic devices located inside the shielded environment using a first transmission element comprising an optical conduit disposed solely within the shielded environment; and transmitting digital optical signals from the plurality of electronic devices to a processor located outside the shielded environment using a second transmission element in response to the digital optical signals transmitted to the plurality of electronic devices, wherein the second transmission element comprises at least one optical fiber.

20. The method of claim 19, wherein the converting occurs within a magnetic bore, wherein the magnetic bore is located within the shielded environment.

21. The method of claim 19, wherein the converting occurs within a imaging volume, wherein the imaging volume is located within the shielded environment.

22. The method of claim 19, wherein converting comprises using a direct conversion technique.

23. The method of claim 22, wherein using the direct conversion technique comprises using a Nyquist converter.

24. The method of claim 22, wherein the direct conversion technique comprises using a band pass converter.

25. The method of claim 19, wherein the converting comprises utilizing an heterodyning receiver system.

26. The method of claim 25, wherein the heterodyning receiver system comprises using a Nyquist converter.

27. The method of claim 19, wherein the digital optical signals are transmitted as a serial output.

28. The method of claim 19, wherein the transmitting comprises transmitting a plurality of digital optical signals in parallel.

29. The method of claim 19, wherein the transmitting comprises transmitting a plurality of digital optical signals; and wherein the plurality of digital optical signals are further combined to generate a single digital optical signal.

30. The method of claim 19, wherein the magnetic system comprises a magnetic resonance imaging system.

31. The method of claim 19, wherein the magnetic system comprises a magnetic resonance spectroscopy system.

32. The method of claim 19, wherein the shielded environment is magnetic field of strength varying from 0.5 Tesla to 18 Tesla.

* * * * *